(12) United States Patent
Casper

(10) Patent No.: US 6,710,241 B2
(45) Date of Patent: Mar. 23, 2004

(54) EMI SHIELDING VENT PANEL

(75) Inventor: Scott J. Casper, North Chelmsford, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 10/439,654

(22) Filed: May 16, 2003

(65) Prior Publication Data

US 2003/0213606 A1 Nov. 20, 2003

Related U.S. Application Data

(60) Provisional application No. 60/381,192, filed on May 16, 2002.

(51) Int. Cl.[7] .................................................. H05K 9/00
(52) U.S. Cl. .................................. 174/35 MS; 454/184
(58) Field of Search ........................ 174/35 R, 35 MS; 361/800, 816, 818; 454/184

(56) References Cited

U.S. PATENT DOCUMENTS

| | | |
|---|---|---|
| 3,546,359 A | 12/1970 | Ciccarelli |
| 3,553,343 A | 1/1971 | Carlington |
| 3,580,981 A | 5/1971 | Lamp |
| 3,584,334 A | 6/1971 | Nichols et al. |
| 3,821,463 A | 6/1974 | Bakker |
| 4,249,033 A | 2/1981 | Darakjy et al. |
| 4,616,101 A | 10/1986 | Veerman et al. |
| 5,007,946 A | 4/1991 | Babini |
| 5,032,689 A | 7/1991 | Halligan et al. |
| 5,202,536 A | 4/1993 | Buonanno |
| 5,401,914 A | 3/1995 | Curran et al. |
| 5,640,869 A | 6/1997 | Takeda et al. |
| 5,734,561 A * | 3/1998 | Wolf et al. .................. 361/800 |
| 5,895,885 A | 4/1999 | Kunkel |
| 5,910,639 A | 6/1999 | Kunkel |
| 5,981,927 A * | 11/1999 | Osepchuk et al. ........... 219/740 |
| 6,211,458 B1 | 4/2001 | Mitchell et al. |
| 6,285,548 B1 * | 9/2001 | Hamlet et al. ............... 361/695 |
| 6,362,417 B2 | 3/2002 | Mitchell et al. |
| 6,506,113 B2 | 1/2003 | Berger |
| 6,610,922 B1 * | 8/2003 | Twiss et al. ............ 174/35 MS |

FOREIGN PATENT DOCUMENTS

| | | |
|---|---|---|
| EP | 0 413 582 | 2/1991 |
| JP | 8-64988 | 3/1996 |
| JP | 08064988 | 8/1996 |
| WO | WO 97/32459 | 9/1971 |
| WO | WO 01/13695 | 2/2001 |

OTHER PUBLICATIONS

International Search Report in PCT Case No. PCT/US00/19700.

Chomerics, Parker–Hannifin Engineering Handbook titled "EMI Shielding for Military/Aerospace Electronics" copyrighted 1996.

(List continued on next page.)

Primary Examiner—Hung V. Ngo
(74) Attorney, Agent, or Firm—John A. Molnar, Jr.

(57) ABSTRACT

An electromagnetic interference (EMI) shielded vent panel. The panel includes an electrically-conductive media having an outer periphery supported within an opening enclosed by an electrically-conductive frame. The frame includes at least a first member and a mating second member which together define the opening for the media. Each of the frame members has an inside face which confronts the media, and an outside face. At least one of the frame members is formed as having a tooth, ridge, or other projection which depends from the inside face thereof as extending about at least a portion of the opening. With the media interposed between the inside faces of the frame members, such projection may be made to engage an overlapping portion of the media to thereby grip or otherwise positively retain the media between the frame members.

8 Claims, 2 Drawing Sheets

OTHER PUBLICATIONS

Technical Bulletin 164 "Streamshield" Vent Panels ©2000.

Chomerics, Parker–Hannifin, "EMI Shielded Vents Shield Cell & Omni Cell® Shielded Vent Panels", Applicants request the Examiner to consider this reference as prior art under 102(a), however, Applicants respectfully reserve the right to supplement this Information Disclosure Statement and take a contrary position should it be necessary.

Chomerics, Parker–Hannifin, "EMI Shielded Vents Slimvent® Shielded Vent Panels", Applicants request the Examiner to consider this reference as prior art under 102 (a), however, Applicants respectfully reserve the right to supplement this Information Disclosure Statement and take a contrary position should it be necessary.

Chomerics, Parker–Hannifin, "EMI Shielded Vents Steel and Brass Honeycomb Shielded Vents", Applicants reques the Examiner to consider this reference as prior art under 102(a), however, Applicants respectfully reserve the right to supplement this Information Disclosure Statement and take a contrary position should it be necessary.

* cited by examiner

EMI SHIELDING VENT PANEL

CROSS-REFERENCE TO RELATED APPLICATIONS

The present application claims the benefit of the filing date of U.S. Provisional Application Serial No. 60/381,192, filed May 16, 2002, the disclosure of which is incorporated herein by reference.

BACKGROUND OF THE INVENTION

The present invention relates broadly to an electromagnetic interference (EMI) shielding or grounding panel assembly including a porous, electrically-conductive shielding media and an electrically-conductive frame for supporting the media, and more particularly to such an assembly which is adapted to cover a corresponding ventilation opening in an electronics housing or other enclosure enclosures and which accommodates the flow of cooling air into the enclosure while maintaining electrical continuity and EMI shielding effectiveness across the opening.

The operation of electronic devices such as televisions, radios, computers, medical instruments, business machines, communications equipment, and the like is attended by the generation of electromagnetic radiation within the electronic circuitry of the equipment. As is detailed in U.S. Pat. Nos. 5,202,536; 5,142,101; 5,105,056; 5,028,739; 4,952,448; and 4,857,668, such radiation often develops as a field or as transients within the radio frequency band of the electromagnetic spectrum, i.e., between about 10 KHz and 10 GHz, and is termed "electromagnetic interference" or "EMI" as being known to interfere with the operation of other proximate electronic devices. "EMI" is used herein interchangeably with the term "radio frequency interference" ("RFI").

For attenuating EMI effects, shielding having the capability of absorbing and/or reflecting EMI energy may be employed both to confine the EMI energy within a source device, and to insulate that device or other "target" devices from other source devices. Such shielding is provided as a barrier which is interposed between the source and the other devices, and most often is configured as an electrically conductive and grounded housing or other enclosure, such as a room, which surrounds the EMI generating circuitry of the source device. However, when such circuitry is contained within the confined space of an enclosure, it often is necessary to provide a cooling or ventilation means to dissipate the heat which is ohmicly or otherwise generated by the circuitry. Most enclosures therefore are formed with one or more air intake and/or exhaust openings or ports for natural or forced convective circulation of air between the interior of the enclosure and the ambient environment.

Left uncovered, such openings would represent a discontinuity in the surface and ground conductivity of the enclosure, with the result of a decrease in the EMI shielding effectiveness of the enclosure. Accordingly, shielded vent panels have been proposed for covering the openings in an manner which allows for the ventilation of the enclosure while electrical continuity, i.e., grounding, across the vent opening is maintained. In basic construction, such vent panels, which are sized to span the corresponding opening in the enclosure, conventionally are formed as including a sheet of a porous, electrically-conductive shielding media, and an electrically-conductive frame member configured to support the media as extending about the outer periphery thereof. The media, which may be an expanded metal mesh or, alternatively, a honeycombed-structured or other cellular structured metal foil, is received in or is otherwise attached to the frame, which typically is provided as an extruded aluminum or other metal profile. The frame, in turn, may be fastened to the enclosure over the opening thereof with screws or the like, with a compressible, electrically-conductive seal or gasket optionally provided for improved electrical contact between the frame and the enclosure.

However, for electrical continuity to be maintained across the opening, good electrical contact must be provided not only as between the frame and the enclosure, but also as between the media and the frame. In this regard, conventional panels may employ a C-shaped frame channel or other extrusion including a V-shaped or other projection or edge integrally formed within one of the sides of the channel. With the periphery of the media being received within the channel, the sides thereof are compressed to cause the projection or edge to penetrate into the media and thereby establish good electrical contact. Vent panels of such type are marketed commercially by the Chomerics Division of Parker-Hannifin Corp. (Woburn, Mass.) under the tradenames "Cho-Cell™," "Shield Cell®," "Omni Cell®," "Slimvent™," and Streamshield™. Alternatively, the media may be fit into the frame and then bonded thereto using a conventional joining technique such as resistance welding, brazing, soldering, or the like. Vent panels of this type are marketed commercially by the Chomerics Division of Parker-Hannifin Corp. under the designation "steel and brass honeycomb shielded vents."

EMI shielding vents also are described in commonly-assigned U.S. Pat. Nos. 6,426,459; 6,362,417; and 6,211,458; 5,032,689. Other vents and materials therefor are described in U.S. Pat. Nos. 3,546,359; 3,580,981; 3,553,343; 3,584,134; 3,821,463; 4,616,101; 4,249,033; 4,616,101; 5,007,946; 5,401,914; 5,895,885; and 5,910,639, JP 8064988, and WO 97/32459.

In view of the proliferation of electronic devices, it is to be expected that continued improvements in EMI shielded vent panels would be well-received by industry, and particularly by the designers of enclosures for personal computers, file servers, telecommunication equipment, and similar systems which now operate at frequencies of 500 MHz or more. Indeed, as the clock speeds of electronic devices continue to increase with the attendant generation of higher frequency EMI radiation and greater heat output, enclosure designers are faced with the seemingly competing requirements of providing both adequate ventilation and effective EMI shielding. In such applications, a honeycomb shielding media, such as is disclosed in U.S. Pat. Nos. 3,821,463; 5,895,885; 5,910,639, often may be considered preferred over other media as known to provide effective EMI shielding at higher frequencies with less restriction to air flow. Moreover, certain applications may specify a cast or similar-type frame construction which, in contrast to an extrusion, may be formed without corner seams and, as a result, may be made more structurally rigid and may be formed into more complex shapes. Ultimately, a preferred vent construction would be economical to manufacture, and would exhibit both reliable EMI shielding performance and good ventilation even in high frequency applications.

BROAD STATEMENT OF THE INVENTION

The present invention is directed to an EMI shielded vent construction including an electrically-conductive frame and an electrically-conductive, porous shielding media member, which is supported by the frame. The frame may be a casting and may be formed into a relatively rigid, relatively complex geometry such as being divided into one or more openings.

Such frame is provided as a two or more piece arrangement including at least an top, upper, or other first frame member and a mating bottom, lower, or other second frame member which together define at least one opening for the media. Each of the frame members has an inside face which confronts the media, and an outside face. At least one of the frame members is formed as having a tooth, ridge, or other projection which depends from the inside face thereof as extending about at least a portion of the opening. With the media interposed between the inside faces of the frame members, such projection may be made to engage an overlapping portion of the media to thereby grip or otherwise positively retain the media between the frame members, and to provide electrical contact between the frame and the media. Advantageously, such retention and contact may be effected without the use of the solders or conductive adhesives which are conventionally employed to retain such media within frames of a casting or similar type.

The present invention, accordingly, comprises the EMI shielded vent panel possessing the combination of elements and construction as exemplified in the detailed disclosure to follow. Advantages of the present invention include a vent panel which exhibits reliable EMI shielding and air flow characteristics. Additional advantages include a panel construction which is economical and which allows for the use of a cast-type frame which may be formed without corner seams and, as a result, may be made more structurally rigid and may be formed into more complex shapes as compared to other frame types such as extrusions. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

Figure 1:
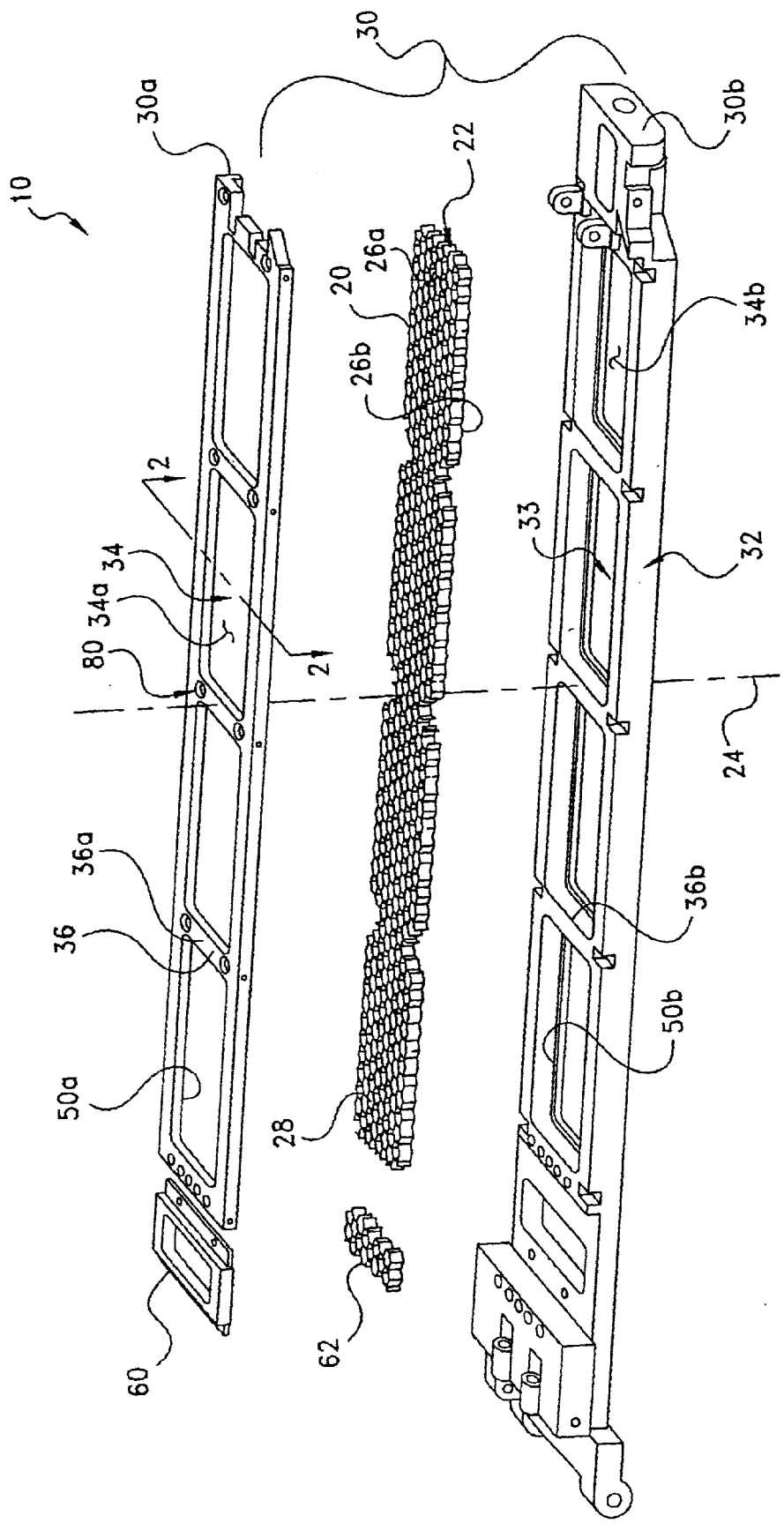
FIG. 1 is a perspective assembly view of an EMI shielded vent panel according to the present invention.

The drawings will be described further in connection with the following Detailed Description of the Invention.

DETAILED DESCRIPTION OF THE INVENTION

Certain terminology may be employed in the following description for convenience rather than for any limiting purpose. For example, the terms "forward" and "rearward," "front" and "rear," "right" and "left," "upper" and "lower," "top" and "bottom," and "right" and "left" designate directions in the drawings to which reference is made, with the terms "inward," "inner," interior "inboard" and "outward," "outer," "exterior," "outside," or "outboard" referring, respectively, to directions toward and away from the center of the referenced element, the terms "radial" or "vertical" and "axial" or "horizontal" referring, respectively, to directions or planes perpendicular and parallel to the longitudinal central axis of the referenced element. Terminology of similar import other than the words specifically mentioned above likewise is to be considered as being used for purposes of convenience rather than in any limiting sense.

In the figures, elements having an alphanumeric designation may be referenced herein collectively or in the alternative, as will be apparent from context, by the numeric portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows or underscores.

For the purposes of the discourse to follow, the precepts of the construction of the EMI shielded vent panel of the invention herein involved are described in connection with a configuration which is mountable onto an electronics enclosure, such as the EMI shielded housing. Within this representative application, the panel may be mounted in a conventional manner using, for examples, screws, bolts, or other fastening members, over a corresponding opening formed within the housing. Such opening generally will be formed as having a predefined outer margin about which the panel may border to cover the opening in a manner providing ventilation without compromising the EMI shielding effectiveness of the housing. As used herein, the term "EMI shielding" should be understood to include, and to be used interchangeably with, electromagnetic compatibility (EMC), surface grounding, corona shielding, radio frequency interference (RFI) shielding, and anti-static, i.e., electro-static discharge (ESD) protection.

It will be appreciated, however, that aspects of the present invention may find utility in other EMI shielding applications. For example, the panel of the invention alternatively may be mounted onto the wall of an EMI shielded room for covering a ventilation opening thereof. Use within those such other applications therefore should be considered to be expressly within the scope of the present invention.

Referring then to the figures wherein corresponding reference characters are used to designate corresponding elements throughout the several views with equivalent elements being referenced with prime or sequential alphanumeric designations, an exemplary EMI shield in accordance with the present invention is shown generally at 10 in the perspective view of FIG. 1. In basic construction, and as may be seen with additional reference to the cross-sectional view of FIG. 2, panel 10 includes an electrically-conductive, media, 20, which may be generally-planar and has an outer periphery, referenced at 22, supported within an opening of an electrically-conductive frame, referenced generally at 30. Frame 30 has an outer margin, referenced at 32, and an inner margin, referenced at 33. The inner and outer margins 32 and 33 enclose the opening, 34, within which the media 20 is supported. For illustrative purposes, the opening 34 is shown to have a generally polygonal geometry that, depending on the intended application, may be sized to fit over a correspondingly dimensioned opening in an enclosure. As may depend upon the configuration of the enclosure opening, however, the opening 34 of frame 30 may be of any shape and size. As also may depend upon the configuration of the enclosure opening, the frame opening 34 may be divided into two or more individual sections by one or more frame dividers, one of which is referenced at 36, which extend across the frame opening 34.

Figure 2:
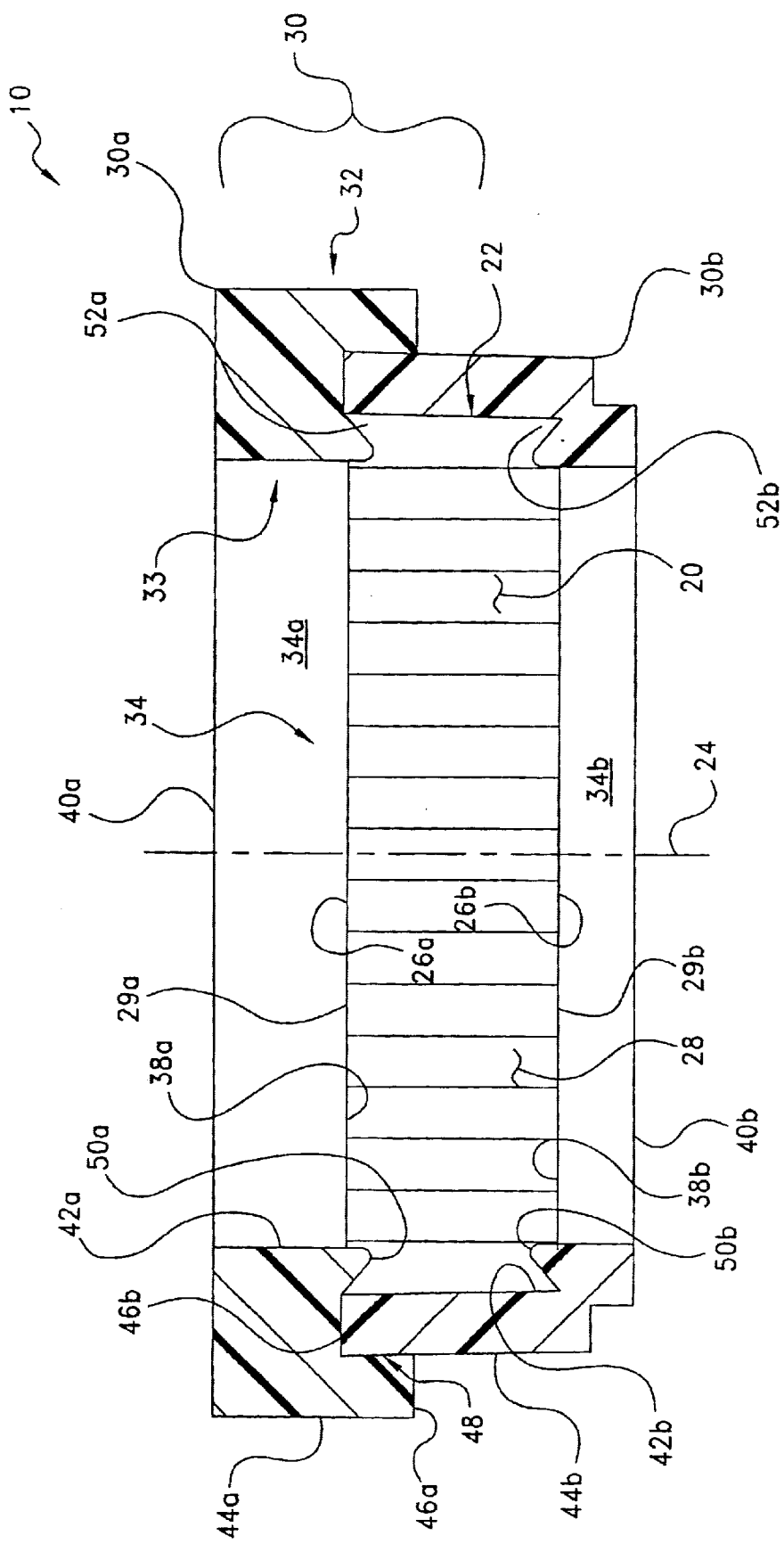
FIG. 2 is a cross-sectional view of the panel of FIG. 1 as assembled taken through line 2—2 of FIG. 1.

Electrically-conductive media 20 extends along a transverse axis, 24, intermediate a pair of opposing faces, 26a–b, defining a thickness dimension therebetween which may range, typically, between about 1/64–1.5 inch (0.4–38 mm). Although media 20 may be provided as a metal screen or expanded metal mesh, it more preferably is provided as one or more layers of a honeycomb material having a hexagonal or other cellular structure which is "open" or otherwise porous to admit the flow of cooling air therethrough for the ventilation of the associated housing or other electronics enclosure. Such cellular structure of media 20, which may be formed from a corrugated sheet of a 1–5 mil (0.039–0.197 mm) thick aluminum or other metal foil, or otherwise as is described in U.S. Pat. Nos. 3,821,463, 5,895,885; and 5,910,639, includes a plurality of cells, one of which is referenced at 28. Each of the cells 28 define a corresponding ventilation passageway of the media 20 as extending through the thickness direction thereof generally along or parallel to the transverse axis 24 from, as is shown in FIG. 2 for the cell referenced at 28, a first end, 29a, which forms a segment of the media face 26a, and a second end, 29b, which forms a segment of the media face 26b. Alternatively, in the case where media 20 is provided in multiple layers, one of the cell second ends 29 may form a segment of an interface between the layers.

Optionally, a dust filter (not shown) may be employed in conjunction with media 20 as disposed parallel thereto in a series arrangement relative to the air flow direction. Such filter may be formed of a screen or a high porosity foam or the like which allows for sufficient air flow therethrough while reducing the transmission of dust or other airborne contaminants into the enclosure. The filter may be attached to the outside, relative to the enclosure, of the frame in a conventional manner, but preferably is made to be removable for easier cleaning and replacement.

Frame 30 preferably is cast or otherwise formed of a metal such as zinc, stainless steel, steel, aluminum, magnesium, or a combination or alloy thereof. Such metal may itself be coated or plated with nickel or other metal or material which may be corrosion resistant, and otherwise may be surface treated such as by nitriding or chromate conversions. Frame 30 also may be molded, stamped, die-cut, machined, welded or otherwise formed, and alternatively may be formed or a plastic or other polymeric material which itself is coated or filled, such as with a powdered metal or other electrically conductive filler, to render it electrically-conductive. Its material of construction notwithstanding, frame 30 includes a top, upper, or other first frame member, 30a, and a mating bottom, lower, or other second frame member, 30b, which members 30a–b together define the opening 34 for the media 20. As shown, each of the frame members 30a–b may be formed as having one or more divider portions, 36a–b, each of which may be disposed for registration with a corresponding divider portion 36a–b on the other frame member 30a or 30b, and together define the divider 36.

As may be seen best in the cross-sectional view of FIG. 2, each of the frame members 30a–b has an inside face, 38a–b, respectively, which confronts the media 20, and an outside face, 40a–b, respectively. The faces 38 and 40 of each of the members 30 may define a thickness dimension therebetween which may range between about 0.078–0.157 inch (2–4 mm) for many applications. Each of the frame members 30a–b also has an inner perimeter 42a–b, respectively, and an outer perimeter, 44a–b, respectively, which may define a widthwise extent of the frame member therebetween. The outer perimeters 44 of each of the frame members 30 each may be further configured to define side walls, 46a–b, respectively, which may overlap in the arrangement shown to define a lap or other seam, 48, therebetween which may be secured metal via screws or other fasteners, or via a snap, compression, friction, or other inference engagement, or by means of a solder, weld, or an adhesive to join the members 30a–b into the assembly of frame 30. It should be appreciated, however, that other arrangements for the joining of the members 30a–b may be envisioned without departing from the scope of the invention herein involved. The inner perimeters 42 of the frame members 30 each defines an opening, 34a–b, respectively, which, when the frame members 30 are assembled in registration, together define the frame opening 34 as such opening may be sectioned by the dividers 36.

At least one and, as shown, each of the frame members 30a–b may be formed as having a tooth, ridge, or other projection, 50a–b, respectively, which depends inwardly towards the media 20 from the inside face 38a or 38b thereof, and which extends either continuous or discontinuously about the entirety or at least a portion of the opening 34, including, if desired, on the dividers 36. Such projections 50 typically may be formed at the inner perimeters 42a–b of the members 30a–b, and otherwise intermediate the inner and outer perimeters 42 and 44. With the thickness dimension of the media 20 being interposed between the inside faces 38a–b of the frame members 30a–b, such projections may be made to engage an overlapping portion, 52a–b, of the media 20, i.e., inwardly of the outer periphery 22 thereof. Such engagement grips or otherwise positively retain the media 20 between the frame members 30a–b as the members are joined, and also provides electrical contact between the frame and the media.

Returning to FIG. 1, it may be seen that additional frames parts, inserts, or overlays, such as the frame member 60 and an associated media 62, also may be provided in the assembly 10. Also, it should be appreciated that although media 20 is shown to be provided as a single piece, individual pieces may be provided for each of the openings 34. Prior to the assembly of the frame members 30 and 60, the media 20 and 62 may be positioned between the mating parts. After assembly, the media thus may be may be retained between the frame parts by the compression or crimping of the projections 50 as shown in FIG. 2.

In the installation of the vent 10 within an EMI shielding enclosure or the like, the outside face 40a–b of one or either of the frame members 30a–b may be disposed about a corresponding opening of the enclosure in an electrically-conductive contact adjacency therewith. For lowering the impedance across the frame-housing interface, an electrically conductive seal or gasket member (not shown) conventionally may be employed as mounted onto the confronting face 40a or 40b of the frame 30a or 30b, or as otherwise interposed between that surface and the enclosure surface. Such gasket may be constructed as having a resilient core element affording gap-filling capabilities which is either loaded, sheathed, or coated with an electrically conductive element. The resilient core element, which may be foamed or unfoamed, solid or tubular, typically may be formed of an elastomeric thermoplastic material such as polyethylene, polypropylene, polyvinyl chloride, or a polypropylene-EPDM blend, or a thermoplastic or thermosetting rubber such as a butadiene, styrene-butadiene, nitrile, chlorosulfonate, neoprene, urethane, silicone, or fluorosilicone. Conductive materials for the filler, sheathing, or coating include metal or metal-plated particles, fabrics, meshes, and fibers. Preferred metals include copper, nickel, silver, aluminum, tin or an alloy such as Monel, with preferred fibers and fabrics including natural or synthetic fibers such as cotton, wool, silk, cellulose, polyester, polyamide, nylon, polyimide. Other conductive particles and fibers such as carbon, graphite, plated glass, or a conductive polymer material may be substituted. The gasket, alternatively, may be provided to be of an all-metal, knitted wire construction, or as a formed-in-place (FIP) bead of a curable, electrically-conductive silicone or urethane composition which is dispensed in a fluent state onto the surface of the frame or housing and then is cured or foamed in situ via the application of heat or with atmospheric moisture.

The panel 10 may be mounted onto the surface of the enclosure using screws, bolts, or other fastening members which may be received though holes, one of which is referenced at 80, provided through the frame members 30. Alternatively, panel 10 may be attached to the housing 14 using an electrically conductive adhesive, or otherwise as configured for an interference fit within the housing opening.

Thus, an EMI shielded vent construction such as for electronics enclosures is described which exhibits reliable EMI shielding in ensuring the grounding of the enclosure across the vent opening. Such construction additional is economical to manufacture, provides for good electrical contact between the shielding media and the frame, and allows for the use of cast or similar types frames which may be of a complex geometry. Vents so constructed in accordance with the present invention have been observed to exhibit an EMI shielding effectiveness per ML-810 (modified) of at least about 60 dB substantially over a frequency range of between about 2.5–12.5 GHz.

As it is anticipated that certain changes may be made in the present invention without departing from the precepts herein involved, it is intended that all matter contained in the foregoing description shall be interpreted in as illustrative rather than in a limiting sense. All references including any priority documents cited herein are expressly incorporated by reference.

What is claimed is:

1. An electromagnetic interference (EMI) shielded vent panel comprising:
    an electrically-conductive frame having an inner and outer margin which enclose a frame opening, the frame comprising:
        a first frame member having an inside and outside face, and an inner perimeter and outer perimeter, the inner perimeter defining a first opening;
        a mating second frame member having an inside and outside face, and an inner and outer perimeter, the inner perimeter defining a second opening disposable in registration with the first opening of the first frame member to define the frame opening; and
        a projection depending inwardly from the inside face of both of the first and second frame members intermediate the inner and outer perimeter thereof,
    the projection extending along at least a portion of the frame opening; and
    one or more layers of an electrically-conductive media supported within the frame opening, the media having an outer periphery and extending in a thickness direction intermediate a pair of faces, the media have a plurality of ventilation passageways extending through the media faces in the thickness direction, and the media faces being interposed between the inside faces of the first and second frame member with the first and the second opening of the frame members being disposed in registration to define the frame opening, and with the outer periphery of the media overlapping the projection of the both of the first and second frame members,
    whereby the projection of the both of the first and second frame members engages the media inwardly of the outer periphery thereof to thereby positively retain the media within the frame.

2. The vent panel of claim 1 wherein said media comprises one or more layers of a metal foil material which is corrugated into a plurality of cells defining the ventilation passageways.

3. The vent panel of claim 1 wherein said media comprises one or more layers of a metal foil material which is corrugated into a plurality of cells defining the ventilation passageways.

4. The vent panel of claim 1 wherein the projection depends inwardly from the inner perimeter of the both of the first and second frame members.

5. The vent panel of claim 1 wherein the outer perimeter of the first and second frame member each defines a side wall of the frame.

6. The vent panel of claim 5 wherein the side walls of the first and second frame members define a seam of the frame therebetween.

7. The vent panel of claim 6 wherein the first and the second frame members are joined together along the seam.

8. The vent panel of claim 1 wherein:
    the frame has at least one divider extending across the frame opening to divide the opening into two or more sections; and
    the first and second frame members each is formed as having at least one divider portion disposed in registration with a corresponding divider portion of the other frame member to define the divider of the frame.

* * * * *